(12) United States Patent
Czornomaz et al.

(10) Patent No.: US 10,103,234 B1
(45) Date of Patent: *Oct. 16, 2018

(54) FABRICATING RAISED SOURCE DRAIN CONTACTS OF A CMOS STRUCTURE

(71) Applicant: International Business Machines Corporation, Armonk, NY (US)

(72) Inventors: Lukas Czornomaz, Zurich (CH); Veeresh V. Deshpande, Zurich (CH); Vladimir Djara, Kilchberg (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/800,499

(22) Filed: Nov. 1, 2017

Related U.S. Application Data

(63) Continuation of application No. 15/481,537, filed on Apr. 7, 2017, now Pat. No. 9,917,164.

(51) Int. Cl.
*H01L 21/336* (2006.01)
*H01L 29/417* (2006.01)
(Continued)

(52) U.S. Cl.
CPC .... *H01L 29/41783* (2013.01); *H01L 21/0217* (2013.01); *H01L 21/0228* (2013.01); *H01L 21/02274* (2013.01); *H01L 21/31053* (2013.01); *H01L 21/31111* (2013.01); *H01L 21/32115* (2013.01); *H01L 21/7684* (2013.01);
(Continued)

(58) Field of Classification Search
CPC .......... H01L 21/0217; H01L 21/02274; H01L 21/0228; H01L 21/31053; H01L 21/31111; H01L 21/32115; H01L 21/76802–21/76817; H01L 21/7684; H01L 29/41783

See application file for complete search history.

(56) References Cited

U.S. PATENT DOCUMENTS 9,607,989 B2 * 3/2017 Wu .................... H01L 27/0922

OTHER PUBLICATIONS

Czomomaz et al., "Fabricating Raised Source Drain Contacts of a CMOS Structure," U.S. Appl. No. 15/481,537, filed Apr. 7, 2017.
(Continued)

*Primary Examiner* — Daniel Shook
(74) *Attorney, Agent, or Firm* — Cantor Colburn LLP; Daniel Morris

(57) ABSTRACT

The invention relates to a method for forming a field effect transistor. The method comprises providing a substrate with a channel layer, forming a gate stack structure on the channel layer, forming first sidewall spacers, forming a raised source and a raised drain on the channel layer and forming second sidewall spacers above the raised source and the raised drain. The method further includes depositing in a an insulating dielectric layer above the gate stack structure, the first sidewall spacers and the second sidewall spacers, planarization of the insulating dielectric layer and selectively etching the second sidewall spacers. Thereby contact cavities are created on the raised source and the raised drain. The method further includes forming a source contact and a drain contact by filling the contact cavities. The invention also concerns a corresponding computer program product.

18 Claims, 8 Drawing Sheets

(51) Int. Cl.
*H01L 21/321* (2006.01)
*H01L 29/66* (2006.01)
*H01L 29/20* (2006.01)
*H01L 29/161* (2006.01)
*H01L 29/06* (2006.01)
*H01L 21/311* (2006.01)
*H01L 21/02* (2006.01)
*H01L 21/768* (2006.01)
*H01L 21/3105* (2006.01)
*H01L 29/08* (2006.01)
*H01L 21/285* (2006.01)

(52) U.S. Cl.
CPC .. *H01L 21/76802* (2013.01); *H01L 21/76877* (2013.01); *H01L 29/0649* (2013.01); *H01L 29/0847* (2013.01); *H01L 29/161* (2013.01); *H01L 29/20* (2013.01); *H01L 29/6656* (2013.01); *H01L 29/66522* (2013.01); *H01L 21/2855* (2013.01); *H01L 21/28556* (2013.01)

(56) References Cited

OTHER PUBLICATIONS

List of IBM Patents or Patent Applications Treated as Related; Date Filed: Nov. 1, 2017, 2 pages.

\* cited by examiner

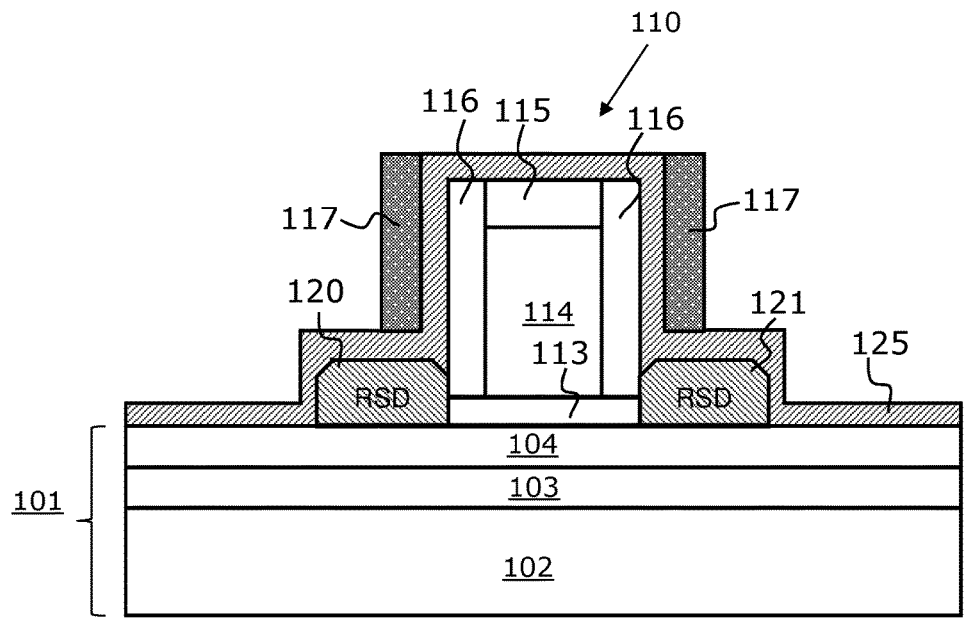
FIG. 3    300
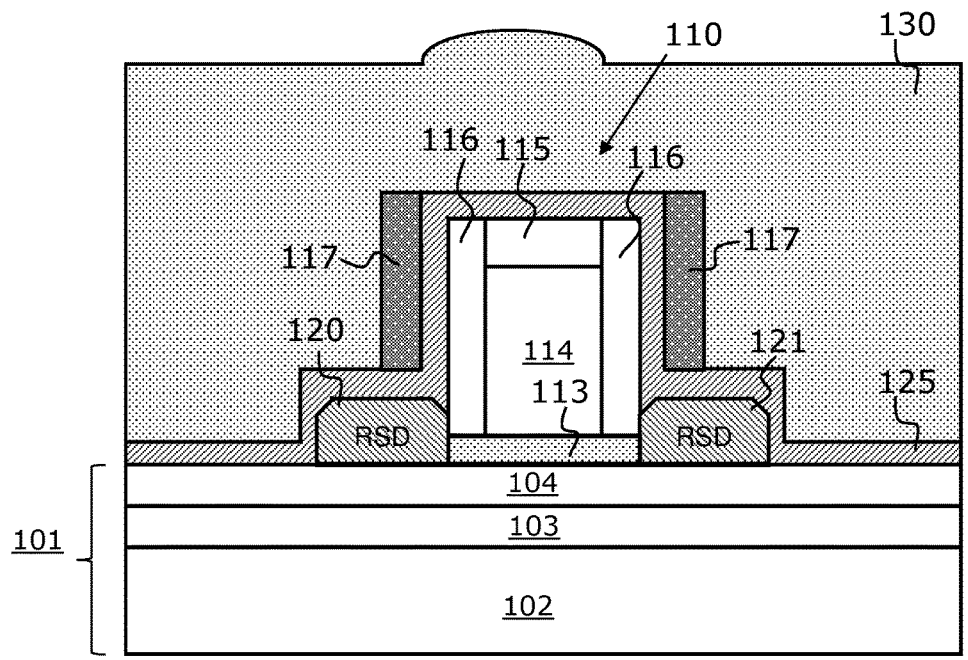
FIG. 4    400

FABRICATING RAISED SOURCE DRAIN CONTACTS OF A CMOS STRUCTURE

DOMESTIC PRIORITY

This application is a continuation of U.S. application Ser. No. 15/481,537, filed Apr. 7, 2017, the contents of which are incorporated by reference herein in its entirety.

BACKGROUND

The embodiments of the invention relate generally to the fabrication of semiconductor devices and more particularly to the fabrication of self-aligned contacts to raised sources and drains of a CMOS structure.

In devices with raised source and drains the source and drain layers are formed above the channel material to achieve low series resistance.

Leading edge CMOS industry is facing strong limitations in lithographic scaling for 10 nm node and beyond. The formation of contacts at advanced nodes is challenging in view of high process complexity and high costs. High-k gate dielectrics are used to scale down the thickness of the gate dielectric.

SUMMARY

According to aspects of the invention, a method for forming a field effect transistor is provided. The method comprises operations of providing a substrate with a channel layer, forming a gate stack structure on the channel layer, forming first sidewall spacers, forming a raised source and a raised drain on the channel layer and forming second sidewall spacers above the raised source and the raised drain. Further operations include depositing an insulating dielectric layer above the gate stack structure, the first sidewall spacers and the second sidewall spacers, planarization of the insulating dielectric layer and selectively etching the second sidewall spacers. Thereby contact cavities are created above the raised source and the raised drain. A further operation comprises forming a source contact and a drain contact by filling the contact cavities.

According to aspects of the invention, a computer program product is provided. The computer program product comprises a computer readable storage medium having computer readable program code embodied therewith, the computer readable program code configured to cause one or more semiconductor processing apparatus to perform the operations of the method of the first aspect.

Embodiments of the invention will be described in more detail below, by way of illustrative and non-limiting examples, with reference to the accompanying drawings.

BRIEF DESCRIPTION OF THE DRAWINGS

FIGS. 1-12 shows various views of successive stages of methods for fabricating a CMOS structure according to embodiments of the invention in which:

FIG. 1 shows a cross sectional view of a starting structure;

FIG. 2 shows a cross-sectional view of the structure of FIG. 1 after the deposition of a liner;

FIG. 3 shows a cross-sectional view of the structure of FIG. 2 after forming second sidewall spacers above a raised source and a raised drain;

FIG. 4 shows a cross-sectional view of the structure of FIG. 3 after the deposition of an oxide layer as insulating dielectric layer;

FIG. 5 shows a cross-sectional view of the structure of FIG. 4 after planarization of the oxide layer;

FIG. 6 shows a cross-sectional view of the structure of FIG. 5 after selectively etching the second sidewall spacers;

FIG. 7 shows a cross-sectional view of the structure of FIG. 6 after etching of the liner;

FIG. 8 shows a cross-sectional view of the structure of FIG. 7 after deposition of a metal layer;

FIG. 9 shows a cross-sectional view of the structure of FIG. 8 after a planarization of the metal layer;

FIG. 10 shows a top view on the structure of FIG. 9;

FIG. 11 shows a top view on the structure of FIG. 10 after a cut mask has been provided;

FIG. 12 shows a top view on the structure of FIG. 11 after the metal layer has been selectively etched to electrically insulate a source contact and a drain contact from each other;

DETAILED DESCRIPTION

In reference to FIGS. 1-14, some general aspects and terms of embodiments of the invention are described first.

A semiconductor substrate may be a bulk semiconductor substrate, a substrate comprising an insulating layer such as a silicon on insulator (SOI) substrate or a hybrid substrate.

A high k-dielectric layer is a layer comprising a dielectric material having a higher dielectric constant k than SiO2. SiO2 has a dielectric constant k of 3.9 and accordingly dielectric materials having a dielectric constant k of more than 3.9 are denoted as high-k materials.

Embodiments of the invention provide methods for forming a field effect transistor and in particular methods for fabricating self-aligned contacts to a source and a drain of a field effect transistor.

FIGS. 1-12 illustrate successive stages of a method for forming a field effect transistor according to embodiments of the invention. FIGS. 1-12 and the other Figures subsequently described below generally show enlarged cross-sectional views or top views of initial, intermediate and final structures formed during the stages of the method. In any or all of the figures the dimensions may not be drawn to scale and may be shown in a simplified and schematic way to illustrate the features and principles of embodiments of the invention. Furthermore, the fillings of the elements and layers are chosen to ease the illustration of the respective structures, but the fillings do not have any specific meaning with respect to the material of the respective element/layer.

Figure 1:
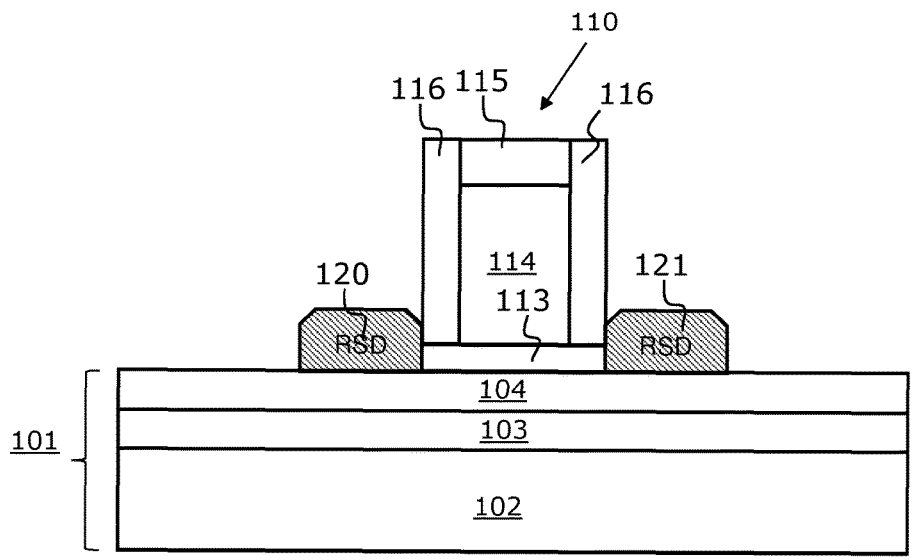

FIG. 1 illustrates a cross-sectional view of a starting structure 100. The starting structure 100 comprises a substrate 101. The substrate 101 is embodied as a semiconductor-on-insulator substrate comprising a base substrate layer 102, an insulating layer 103 and a channel layer 104 disposed on the insulating layer 103. The base substrate layer 102 may be e.g. embodied as a Si substrate. On the base substrate layer 102 the insulating layer 103 is provided. The insulating layer 103 may be embodied e.g. as a dielectric layer comprising SiO2 and may be in the following also denoted as a buried oxide (BOX) layer. The thicknesses of the base substrate layer 102 and the insulating layer 103 can be any suitable thicknesses. On the insulating layer 103 the channel layer 104 is formed that comprises a semiconductor material. According to embodiments the semiconductor material of the channel layer 104 may be embodied as $Si_xGe_{1-x}$, where x=0 to 1. In other words, the semiconductor material may be embodied as Silicon (Si), Germanium (Ge) or a SiGe alloy. In the following references to SiGe shall be understood as references to SixGe1-x where x=0 to 1.

According to embodiments of the invention, the semiconductor material of the channel layer 104 may be embodied as a group III-V compound material. According to embodiments of the invention, the semiconductor material of the channel layer 104 may be InxGa1-xAs where x=0 to 1, i.e. from GaAs to InAs. According to embodiments of the invention, the semiconductor material of the channel layer 104 may be InP or InGaSb. According to embodiments of the invention, further alloyed combinations of (In, Ga) and (As, Sb, P) may be used.

The channel layer 104 may have a thickness of, for example, about 5-50 nm that corresponds to a desired channel thickness of a subsequently formed field effect transistor (FET).

According to embodiments of the invention, the channel layer 104 could be formed directly on a bulk substrate, e.g. a bulk Si-substrate.

The substrate 101 may also be denoted as wafer 101.

SiGe is a useful material for the implementation of a P-Channel Field Effect Transistor (PFET) in view of its high hole mobility. Group III-V materials are useful materials for implementing a N-Channel Field Effect Transistor (NFET) as they exhibit a high electron mobility.

On the channel layer 104 a gate stack structure 110 has been formed. The gate stack structure 110 comprises a gate dielectric layer 113, a gate metal layer 114, a gate cap layer 115 deposited on the gate metal layer 114 and first sidewall spacers 116.

The gate dielectric layer 113 may be embodied as a high-k dielectric layer comprising HfO2, HfON, HfSiON, ZrO2, ZrON, HfO2, HfON, ZrO2, ZrON, LaO3, La—Al—O, La—Lu—O, SiN or SiON. The gate metal layer 114 may comprise e.g. Ti, Hf, TiN, Al or W. The gate cap layer 115 may be in particular embodied as hard mask layer comprising or consisting of a high temperature oxide, in particular SiO2. According to another embodiment the gate cap layer may comprise or consist of SiNx.

The formation of the gate dielectric layer 113, the formation of the gate metal layer 114 and the formation of the gate cap layer 115 may be performed by methods well known in the art, in particular by atomic layer deposition (ALD) or generally any other suitable methods such as chemical vapor deposition (CVD) methods, followed by a lithography and etching operation, e.g. by photolithography including application of a photoresist, light exposure, developing, etching and photoresist removal. According to other embodiments electron beam lithography or other suitable lithography methods may be used.

The first sidewall spacers 116 may be in particular embodied as spacers comprising a high temperature oxide (HTO), e.g. SiO2. According to another embodiment the first sidewall spacers 116 may comprise or consist of SiN. The first sidewall spacers 116 may be formed by e.g. ALD or CVD techniques.

Furthermore, a raised source 120 and a raised drain 121 have been formed on the channel layer 104. More particularly, the raised source 120 and the raised drain 121 have been formed adjacent to the gate stack structure 110. The raised source 120 and the raised drain 121 are also commonly referred to as RSD.

The formation of the raised source 120 and the formation of the raised drain 121 may be done by methods well known, in particular selective epitaxy operations to deposit the raised source and the raised drain on the channel layer. In such devices with raised source and drains the source and drain layers are formed above the channel regions to achieve low series resistance.

Figure 2:
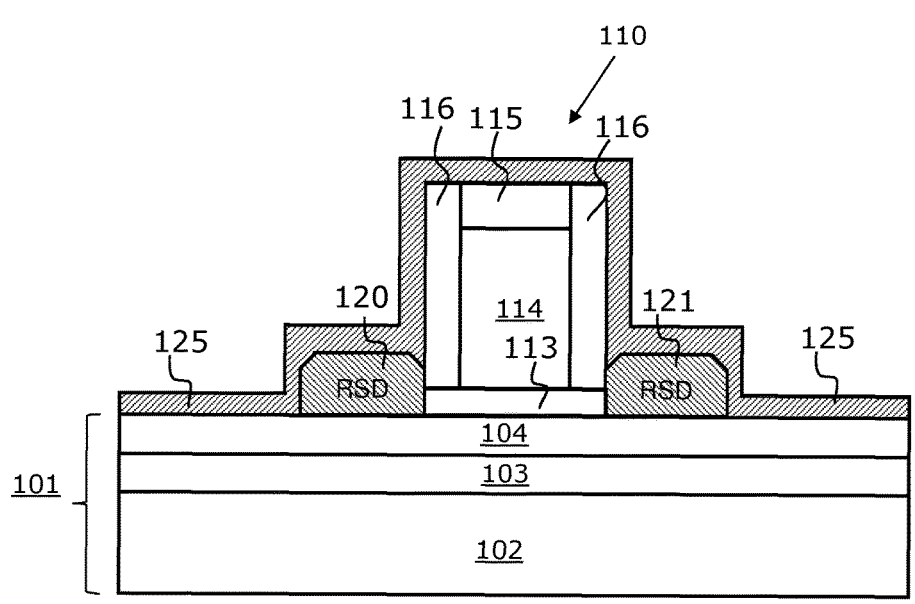

FIG. 2 shows as structure 200 a cross-sectional view of the structure of FIG. 1 after the deposition of a liner 125. The liner 125 has been deposited in a conformal way on the gate stack structure 110, the raised source 120, the raised drain 121 and the channel layer 104. The deposition of the liner 125 may be performed by atomic layer deposition, plasma enhanced atomic layer deposition or plasma enhanced chemical vapor deposition. The liner 125 may comprise e.g. as liner material Al2O3, HfO2, ZrO2, AlON, SiO2, Si3N4 or Hf. The liner may have e.g. a thickness between 2 nm to 8 nm or between 3 nm to 7 nm.

FIG. 3 shows as structure 300 a cross-sectional view of the structure of FIG. 2 after forming second sidewall spacers 117 above the raised source 120 and the raised drain 121.

The formation of the second sidewall spacers 117 may be done by methods well known in the art, in particular by ALD or CVD techniques. The second sidewall spacers 117 are used as a sacrificial layer that will be later on used to form the contacts to the raised source 120 and the raised drain 121 respectively. The second sidewall spacers 117 may be in particular embodied as spacers comprising or consisting of SiN. According to embodiments the first sidewall spacers 116 and the second sidewall spacers 117 are formed by a different material. This facilitates a selective etching in subsequent process operations.

FIG. 4 shows as structure 400 a cross-sectional view of the structure of FIG. 3 after the deposition of an insulating dielectric layer 130. The insulating dielectric layer 130 may be in particular embodied as oxide layer 130. The insulating dielectric layer 130 has been deposited on the liner 125 and the second sidewall spacers 117 in a non-conformal way and accordingly above the gate stack structure 110, the raised source 120 and the raised drain 121 The non-conformal deposition of the insulating dielectric 130 may be performed by chemical vapor deposition, in particular by plasma enhanced chemical vapor deposition. The insulating dielectric layer 130 may be formed by SiO2. The insulating dielectric layer 130 may establish an interlayer dielectric (ILD). According to other embodiments the insulating dielectric layer 130 may also be deposited by conformal deposition techniques.

Figure 5:
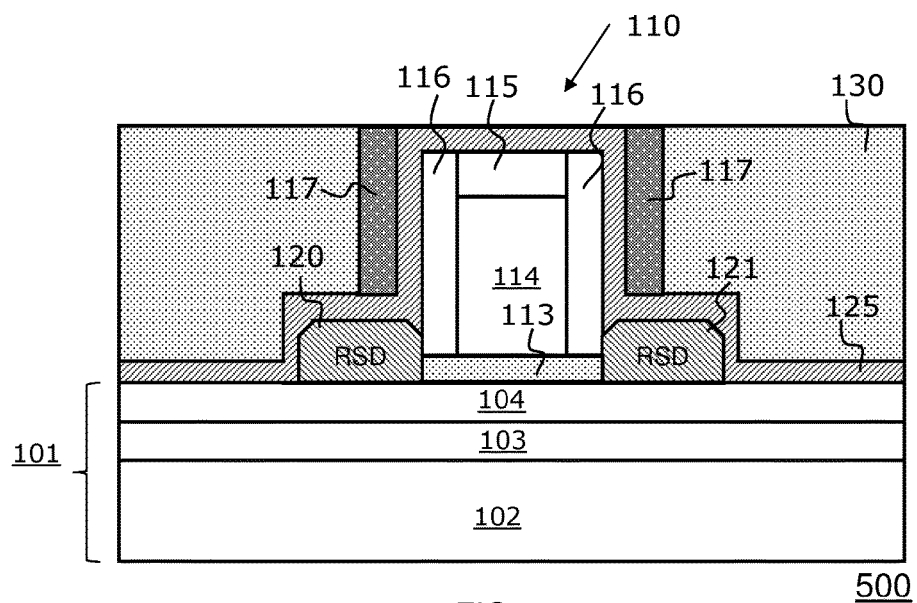

FIG. 5 shows as structure 500 a cross-sectional view of the structure of FIG. 4 after planarization of the insulating dielectric layer 130. The planarization may be performed e.g. by chemical mechanical planarization (CMP).

Figure 6:
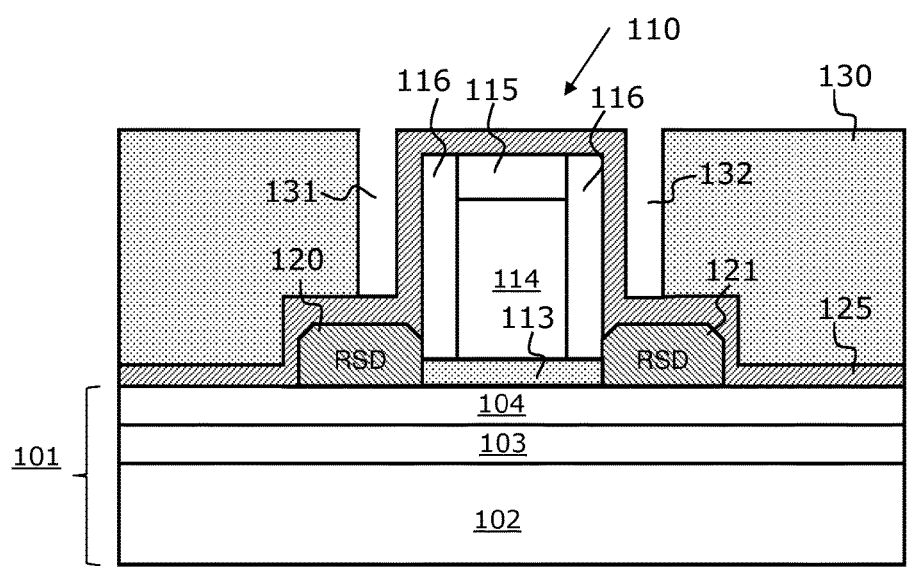

FIG. 6 shows as structure 600 a cross-sectional view of the structure of FIG. 5 after selectively etching the second sidewall spacers 117. Thereby a contact cavity 131 has been formed above the raised source 120 and a contact cavity 132 has been formed above the raised drain 121.

The selective etching performs an etching of the material of the second sidewall spacers 117 selective to the material of the liner 125. In this respect the liner 125 facilitates the selective etching. According to embodiments the liner 125 comprises Al2O3 and the second sidewall spacers comprise SiN. According to embodiments of the invention, an etching of SiN is performed selective to Al2O3.

According to embodiments of the invention, the selective etching of the second sidewall spacers 117 may be performed by wet etching, in particular by wet etching in a phosphoric acid. The latter is in particular suited to perform an etching of SiN selective to Al2O3.

According to embodiments of the invention, the selective etching of the second sidewall spacers 117 may be performed by dry etching, in particular by dry etching in a fluoride based chemistry. The latter is in particular suited to perform an etching of SiN or SiO2 selective to Al2O3.

Suitable dry etching techniques include according to embodiments inductively coupled plasma etching, reactive ion etching, electron cyclotron resonance etching or helicon etching.

As a result, the raised source 120 and the raised drain 121 are only covered by the liner 125 within the contact cavities 131, 132.

Figure 7:
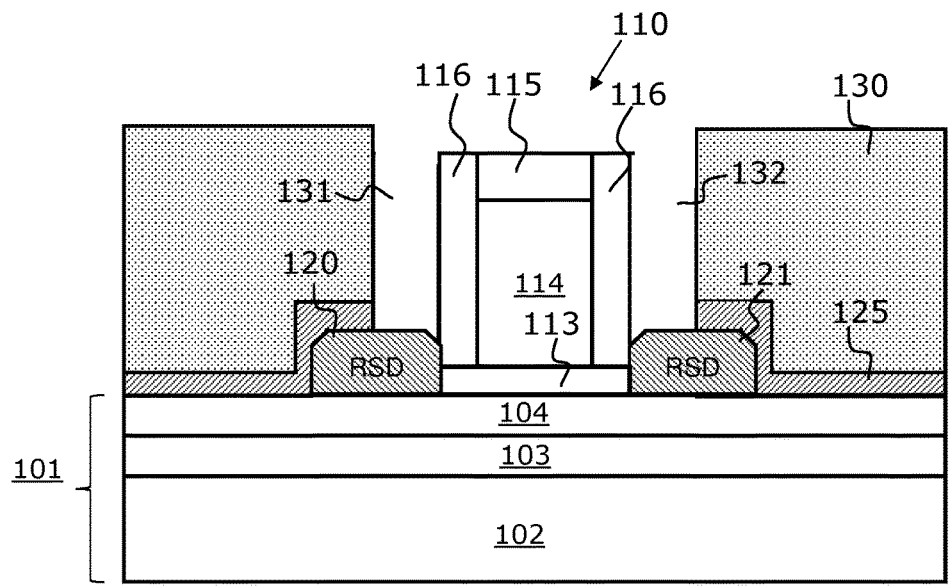

FIG. 7 shows as structure 700 a cross-sectional view of the structure of FIG. 6 after etching of the liner 125. More particularly, the liner 125 has been etched away from the surface of the raised source 120 and the raised drain 121. In addition, the liner 125 has been etched away from the surface of the gate stack structure 110, in particular from the surface of the first sidewall spacers 116 and from the surface of the gate cap layer 115. This has enlarged the contact cavities 131, 132.

According to embodiments the etching of the liner 125 is performed as an etching of the material of the liner 125 selective to the material of the first sidewall spacers 116, the material of the gate cap layer 115 and selective to the material of the raised source 120 and the raised drain 121.

The liner etch may be performed by wet etching techniques, in particular by wet etching techniques based on hydrofluoric acid (HF) in varying dilutions or buffered HF, tetramethylammonium hydroxide (TMAH) or potassium hydroxide (KOH). As a result, the surface of the raised source 120 and the raised drain 121 have been exposed. This facilitates the subsequent fabrication of contacts to the exposed surfaces of the raised source 120 and the raised drain 121 as will be described in the following.

Figure 8:
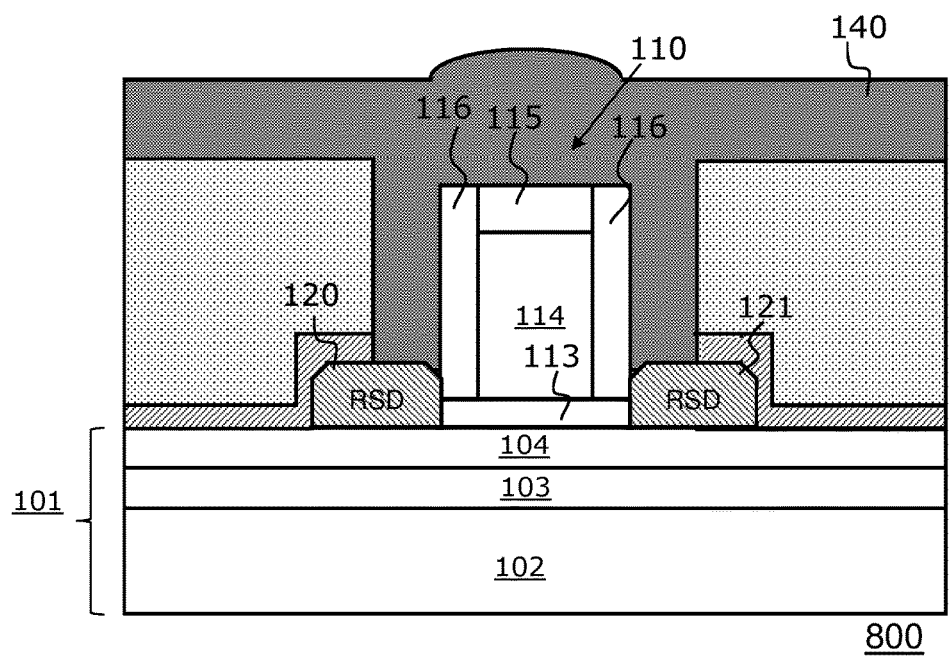

FIG. 8 shows as structure 800 a cross-sectional view of the structure of FIG. 7 after a deposition of a metal layer 140. The deposition of the metal layer 140 may be performed by chemical vapor deposition, physical vapor deposition, metal atomic layer deposition, metal plasma enhanced atomic layer deposition or combinations thereof.

Figure 9:
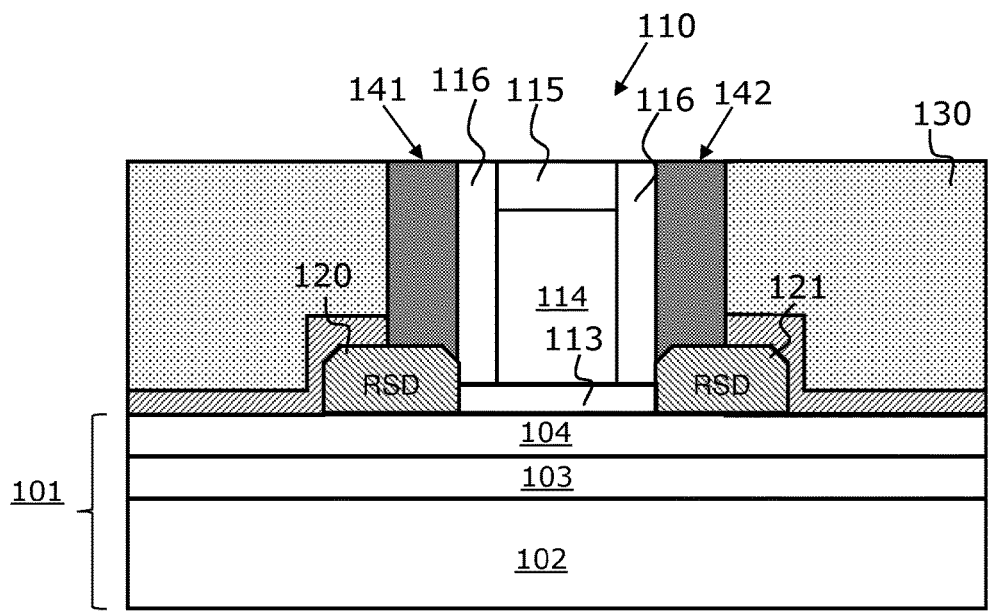

FIG. 9 shows as structure 900 a cross-sectional view of the structure of FIG. 8 after a planarization of the metal layer 140. The planarization may be performed in particular by chemical mechanical planarization.

As a result, a source contact 141 has been formed that is electrically connected to the raised source 120 and a drain contact 142 has been formed that is electrically connected to the raised drain 121. The contacts 141, 142 have been formed in a self-aligned way and hence are self-aligned contacts to the raised source 120 and the raised drain 121 respectively. More particularly, the source contact 141 and the drain contact 142 form self-aligned contacts with respect to the gate stack structure 110.

Figure 10:
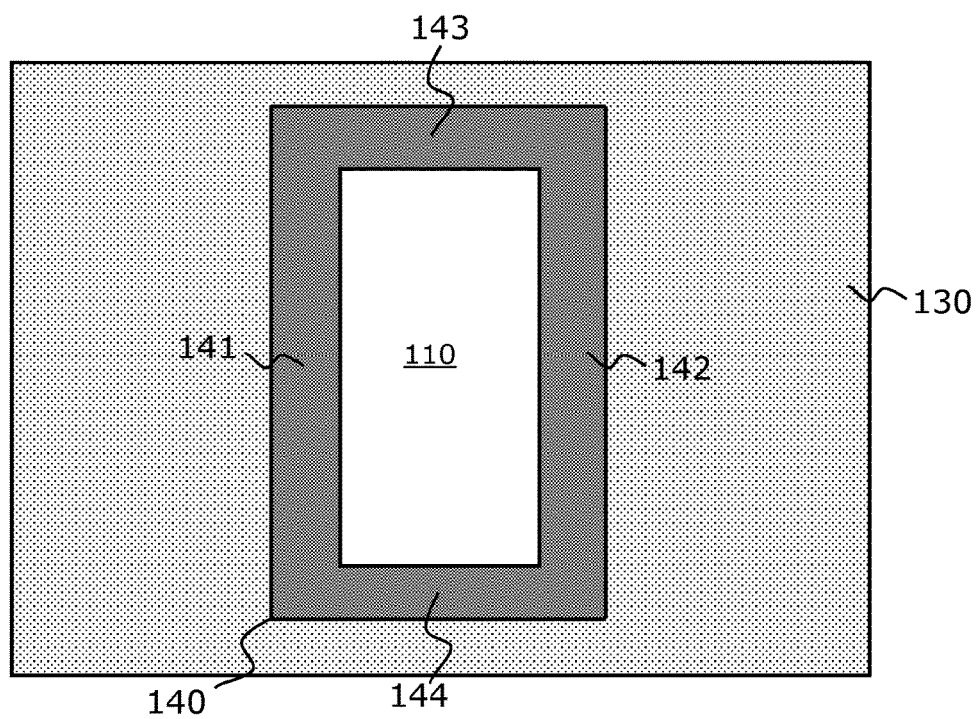

FIG. 10 shows a top view on the structure 900 of FIG. 9. As illustrated in FIG. 10, the drain contact 141 and the source contact 142 are still electrically connected with each other by metallic side portions 143 and 144. Accordingly, the source contact 141 and the drain contact 142 are still shorted. In the following it is described how this short can be eliminated in an efficient way.

Figure 11:
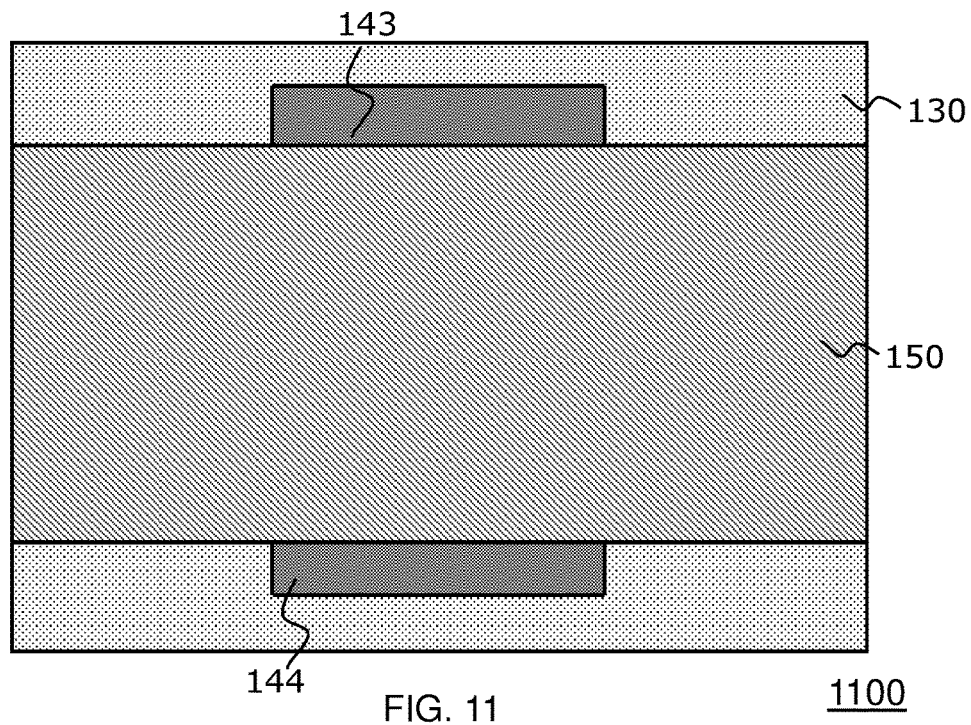

FIG. 11 shows a top view on a structure 1100 after a cut mask 150 has been provided on the structure 900 of FIG. 10. The cut mask 150 is designed to pattern the metal layer 140 by means of the cut mask 150 and more particularly to insulate the source contact 141 and the drain contact 142 from each other. In other words, the cut mask 150 has been designed such that the metallic side portions 143 and 144 of the metal layer 140 can be etched away.

Figure 12:
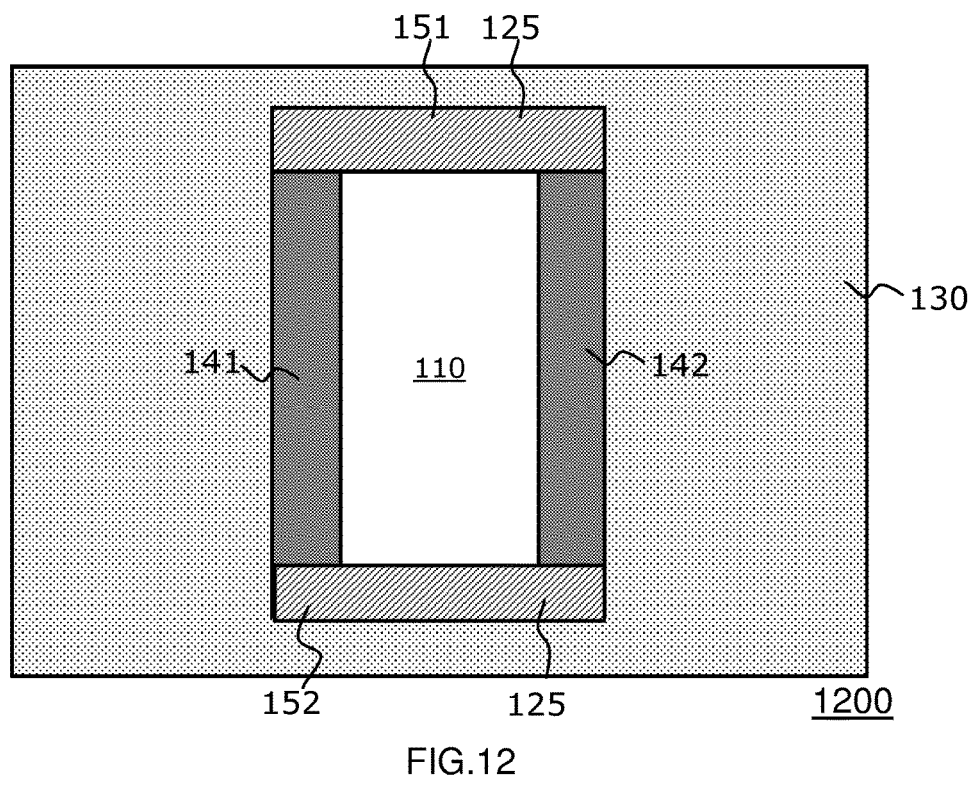

FIG. 12 shows a top view on a structure 1200 after the metal layer 140 has been etched selectively to the insulating dielectric layer 130. More particularly, the metallic side portions 143, 144 of the metal layer 140 have been etched away such that an insulating cavity 151 and an insulating cavity 152 have been formed that insulate the source contact 141 and the drain contact 142 from each other. The etching of the metal layer 140 within the area of the metallic side portions 143, 144 may be performed down to the liner 125 or down to the insulating (BOX) layer 103. In the embodiment illustrated in FIG. 12 the etching of the metal layer 140 within the area of the metallic side portions 143, 144 is performed down to the liner 125 as illustrated by using the same filling.

Subsequently, the insulating cavities 151, 152 may be filled with an insulating material.

According to embodiments, the filling of the insulating cavities 151, 152 comprises depositing an insulating layer in and/or on the insulating cavities 151, 152 and planarization of the insulating layer.

The operation of patterning the metal layer 140 can be performed by low-resolution lithography, also denoted as cut mask etch.

According to embodiments, the filling of the insulating cavities 151, 152 may be performed during deposition of an interlayer dielectric (ILD). In particular, the filling of the insulating cavities 151, 152 may be performed during upper contact level ILD deposition. The ILD deposition may be followed by an operation of chemical mechanical planarization.

As described above, the patterning of the metal layer 140 and the formation of the contacts 141, 142 can be implemented without a high resolution lithography operation. More particularly, only a low-resolution lithography operation based on a cut-mask etch is needed. This provides significant cost advantages and eases the fabrication process compared with a high resolution lithography operation. A low resolution lithography is generally understood as a lithography with a resolution of less than at least 1.5 times that of the lowest pitch in the technology, which is usually the first metal level.

Figure 13:
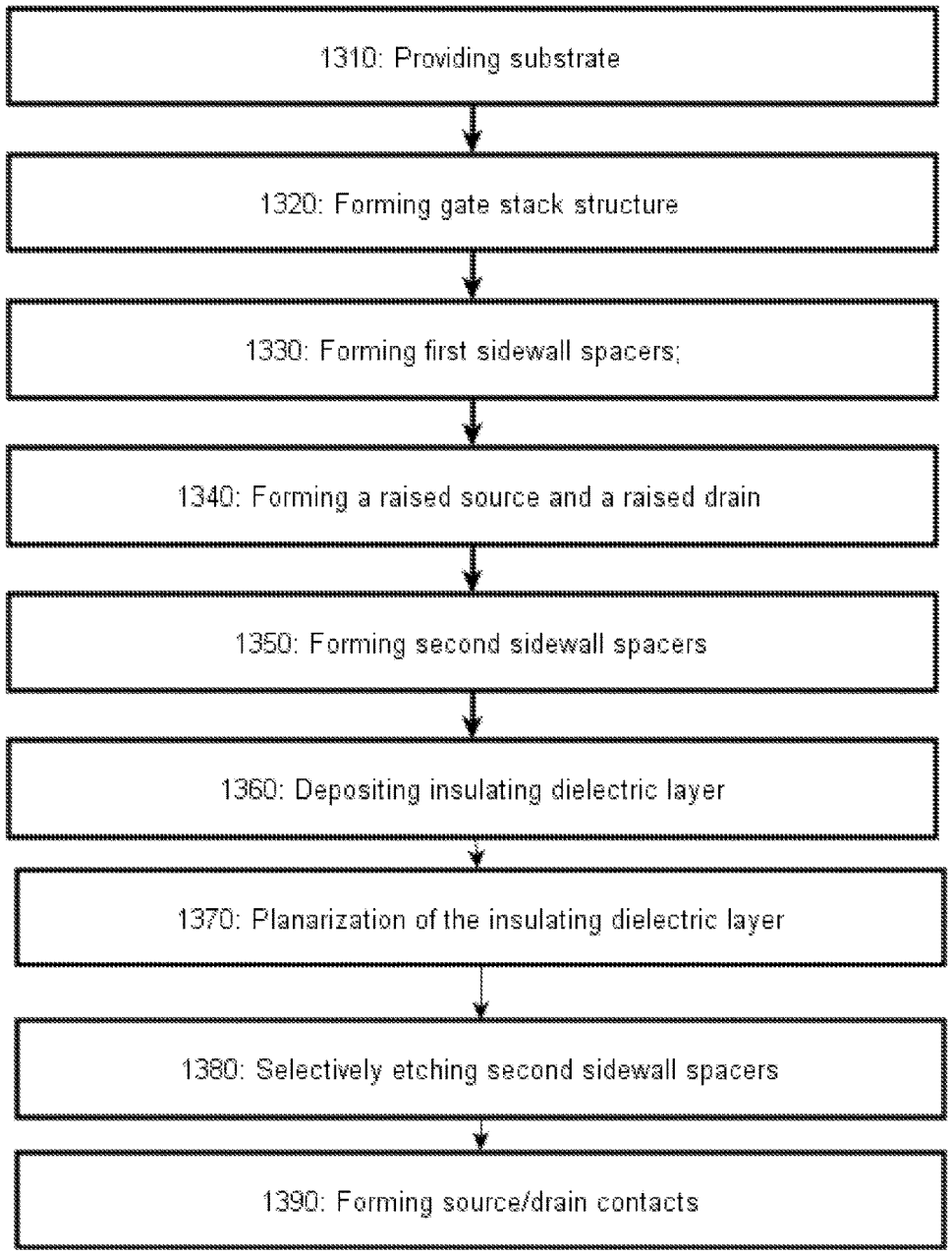
FIG. 13 shows a flow chart of a method according to embodiments of the invention.

FIG. 13 shows a flow chart 1300 of a method for forming a field effect transistor according to embodiments of the invention.

At an operation 1310, a substrate with a channel layer is provided.

At an operation 1320, a gate stack structure is formed on the channel layer.

At an operation 1330, first sidewall spacers are formed.

At an operation 1340, a raised source and a raised drain are formed on the channel layer.

At an operation 1350, second sidewall spacers are formed above the raised source and the raised drain.

At an operation 1360, an insulating dielectric layer, in particular an oxide layer, is deposited above the gate stack structure, the first sidewall spacers and the second sidewall spacers. The deposition may be in particular performed in a non-conformal way.

At an operation 1370, a planarization of the insulating dielectric layer is performed.

At an operation 1380, the second sidewall spacers are selectively etched and thereby removed. As a result, contact cavities are created on the raised source and the raised drain.

At an operation 1390, a source contact and a drain contact are formed by filling the contact cavities with a contact plug material, in particular a metal.

Hence according to methods embodying the invention second sidewall spacers are formed on/above the raised source and the raised drain. The second sidewall spacers are used as a sacrificial layer that is replaced subsequently by contact plug material to form the contacts to the raised source and the raised drain.

Integrated circuit chips resulting from the techniques described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present invention are described above with reference to semiconductor processing operations according to embodiments of the invention. It will be understood that the operations can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Figure 14:
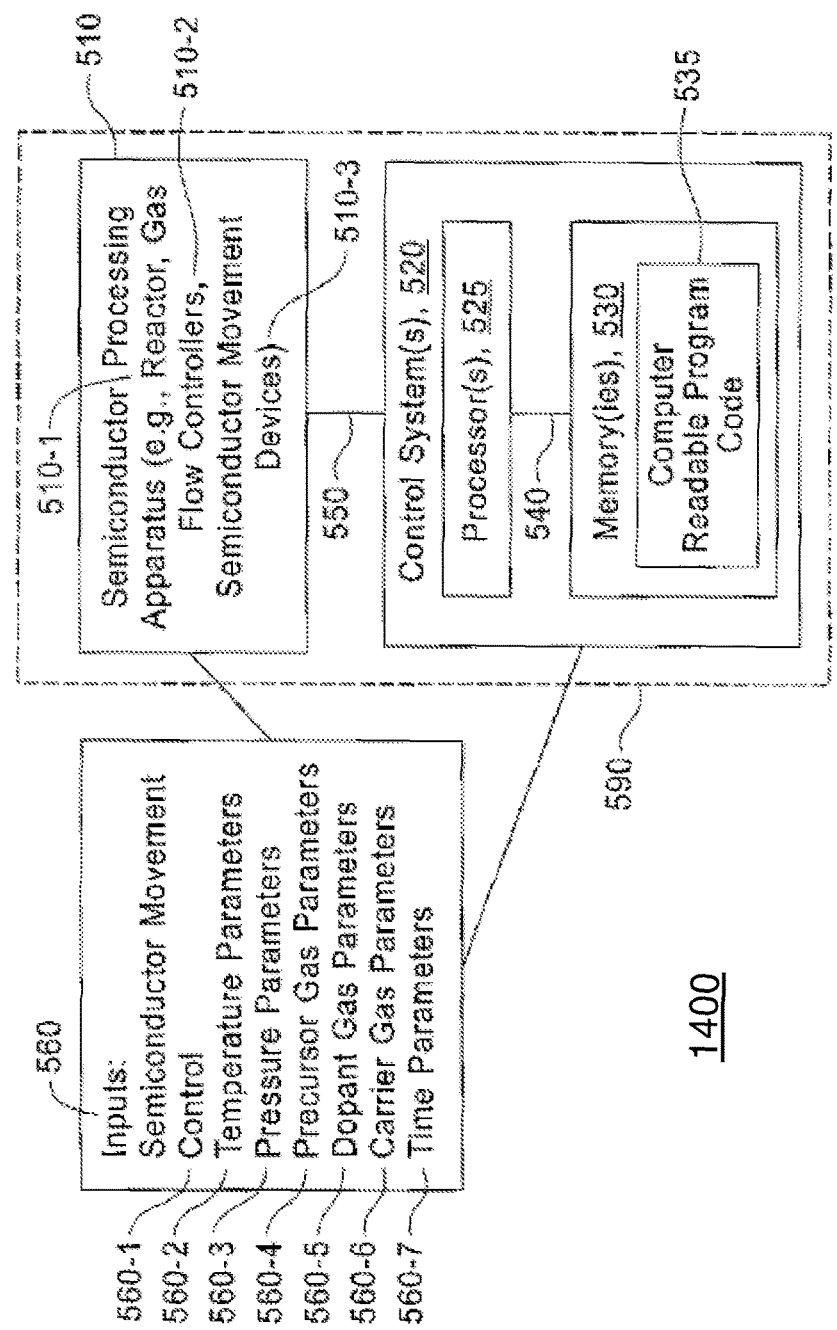
FIG. 14 shows a system suitable for performing the processing shown in FIGS. 1-13.

For instance, an exemplary system 1400 suitable for performing the processing shown in FIGS. 1-13 (and additional processing if desired) is shown in FIG. 14. In FIG. 14, one or more control systems 520 (e.g., computers) comprise one or more processors 525 coupled to one or more memories 530 via one or more networks (e.g., buses) 540. The one or more control systems 520 are coupled via one or more networks 550 to semiconductor processing apparatus 510 such as a reactor 510-1 (e.g., CVD tool), gas flow controllers 510-2 (e.g., if separate from the reactor 510-1) and semiconductor movement devices 510-3 (e.g., wafer positioning and movement systems). The one or more memories 530 comprise computer readable program code suitable for causing the semiconductor processing apparatus 510 to perform operations such as the operations illustrated in FIGS. 1-14.

The one or more control systems 520 may also manipulate the inputs 560 to the semiconductor processing apparatus 510. Such inputs 560 may include, e.g., semiconductor movement control parameters 560-1 (e.g., at what time a wafer should be moved, where the wafer should be placed), temperature parameters 560-2 (e.g., temperature of the wafer, potentially with ramp up or down rates), pressure parameters 560-3 (e.g., of the interior of the reactor 510-1), precursor gas parameters 560-4 (e.g., flow rates for particular precursors, which precursor gas should be used and for how long), dopant gas parameters 560-5 (e.g., flow rates for particular dopant gases, which dopant gas should be used and for how long), carrier gas parameters 560-6 (e.g., flow rates, which carrier gas should be used and for how long), and time parameters 560-7 (e.g., how long the reactor should process wafers at particular temperatures). It should be noted that a semiconductor processing apparatus 510 may include a corresponding control system 520 to create an integral semiconductor processing apparatus 590. For instance, an "integral" reactor 590 may have a corresponding control system 520 attached to a reactor 510-2. The control system 520 in such a case may be networked via one or more networks 550 to enable the control system 520 to be loaded with the computer readable program code 535.

Accordingly, the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a field effect transistor, the method comprising:
   providing a substrate with a channel layer;
   forming a gate stack structure on the channel layer;
   forming first sidewall spacers;
   forming a raised source and a raised drain on the channel layer;
   forming second sidewall spacers above the raised source and the raised drain;
   depositing an insulating dielectric layer above the gate stack structure, the first sidewall spacers and the second sidewall spacers;
   planarization of the insulating dielectric layer;
   selectively etching the second sidewall spacers, thereby creating contact cavities above the raised source and the raised drain; and
   forming a source contact and a drain contact by filling the contact cavities, wherein forming the source contact and the drain contact comprises:
   depositing a metal layer; and
   planarization of the metal layer.

2. A method as claimed in claim 1, wherein depositing the metal layer is performed by chemical vapor deposition, physical vapor deposition, atomic layer deposition, plasma enhanced atomic layer deposition or combinations thereof.

3. A method as claimed in claim 1, wherein forming the source contact and the drain contact further comprises:
   providing a cut mask; and
   patterning the metal layer by means of the cut mask to insulate the source contact and the drain contact from each other.

4. A method as claimed in claim 3, further comprising:
   selectively etching the metal layer to form insulating cavities that insulate the drain contact and the source contact from each other.

5. A method as claimed in claim 4, further comprising:
   filling the insulating cavities with an insulating material, the filling of the insulating cavities comprising:

depositing an insulating layer in and/or on the insulating cavities; and planarization of the insulating layer.

6. A method as claimed in claim 5, wherein the filling of the insulating cavity is performed during deposition of an interlayer dielectric.

7. A method as claimed in claim 3, wherein patterning the metal layer is performed by low-resolution lithography.

8. A method as claimed in claim 1, wherein the gate stack structure comprises:

a gate dielectric layer;

a gate metal layer; and a gate cap layer deposited on the gate metal layer.

9. A method as claimed in claim 1, comprising:

depositing in a conformal way a liner on the gate stack structure, the raised source and the raised drain.

10. A method as claimed in claim 9, wherein depositing the liner is performed by atomic layer deposition, plasma enhanced atomic layer deposition or plasma enhanced chemical vapor deposition.

11. A method as claimed in claim 9, wherein the liner comprises a material selected from the group consisting of: $Al_2O_3$, $HfO_2$, $ZrO_2$, AlON, $SiO_2$, $Si_3N_4$, and SiON.

12. A method as claimed in claim 9, further comprising: performing a liner etch to remove the liner from the raised source and the raised drain.

13. A method as claimed in claim 12, wherein the liner etch is performed by wet etching techniques based at least in part on hydrofluoric acid, tetramethylammonium hydroxide or potassium hydroxide.

14. A method as claimed in claim 1, wherein the second sidewall spacers comprise SiN and wherein the selective etching of the second sidewall spacers is performed by wet etching in a phosphoric acid.

15. A method as claimed in claim 1, wherein the selective etching of the second sidewall spacers is performed by dry etching in a fluoride based chemistry.

16. A method as claimed in claim 1, wherein:

the planarization of the insulating dielectric layer is performed by chemical mechanical planarization.

17. A method as claimed in claim 1, wherein the substrate is a semiconductor-on-insulator substrate comprising a base substrate layer, an insulating layer and the channel layer on the insulating layer.

18. A method as claimed in claim 1, wherein the channel layer is selected from the group consisting of: $Si_xGe_{1-x}$ where x=0 to 1; $In_xGa_{1-x}As$ where x=0 to 1; InP; InGaSb and further alloyed combinations of (In, Ga) (As, Sb, P).

* * * * *